United States Patent [19]
Chen et al.

[11] Patent Number: 5,821,014
[45] Date of Patent: Oct. 13, 1998

[54] OPTICAL PROXIMITY CORRECTION METHOD FOR INTERMEDIATE-PITCH FEATURES USING SUB-RESOLUTION SCATTERING BARS ON A MASK

[75] Inventors: Jang Fung Chen, Cupertino; Kurt Wampler, Sunnyvale; Thomas L. Laidig, Pt. Richmond, all of Calif.

[73] Assignee: Microunity Systems Engineering, Inc., Sunnyvale, Calif.

[21] Appl. No.: 808,587

[22] Filed: Feb. 28, 1997

[51] Int. Cl.⁶ .................................................. G03F 9/00
[52] U.S. Cl. .................................................. 430/5; 430/30
[58] Field of Search ........................................ 430/5, 30

[56] References Cited

U.S. PATENT DOCUMENTS 5,242,770  9/1993  Chen et al. .................................. 430/5
5,340,700  8/1994  Chen et al. ................................ 430/312

*Primary Examiner*—Christopher G. Young
*Attorney, Agent, or Firm*—Burns, Doane, Swecker & Mathis, L.L.P.

[57] ABSTRACT

A method for providing scattering bars for optical proximity effect correction on a mask used in a lithographic process. Scattering bar spacing and characteristics are adjusted and varied along with primary feature edge location in order to control CD's of features that are spaced a distance greater than the minimum pitch of a lithographic process but less than a nominal distance for two feature edges having independent scattering bars.

25 Claims, 6 Drawing Sheets

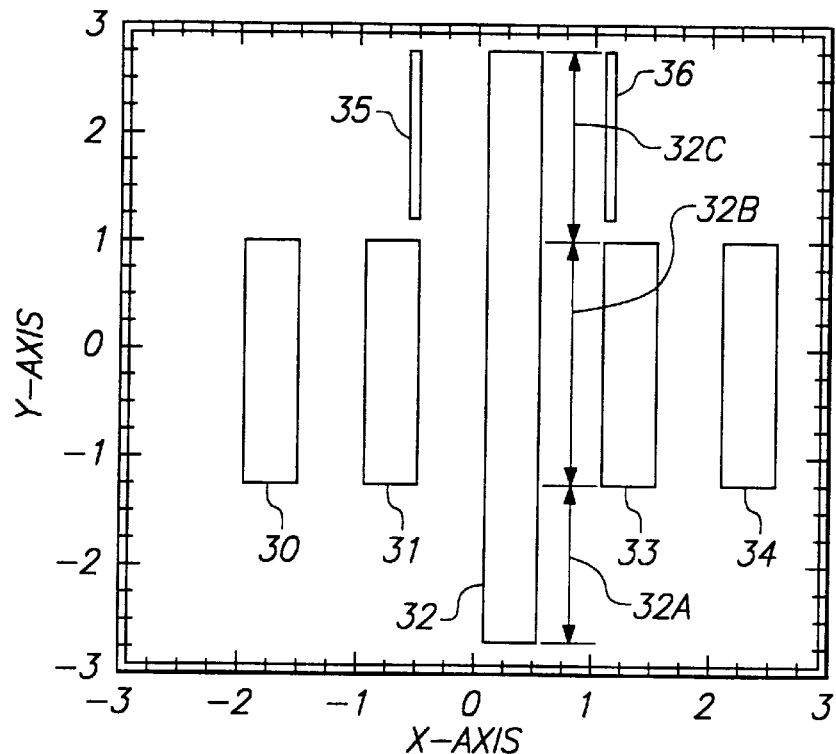
FIG. 2A *(PRIOR ART)*
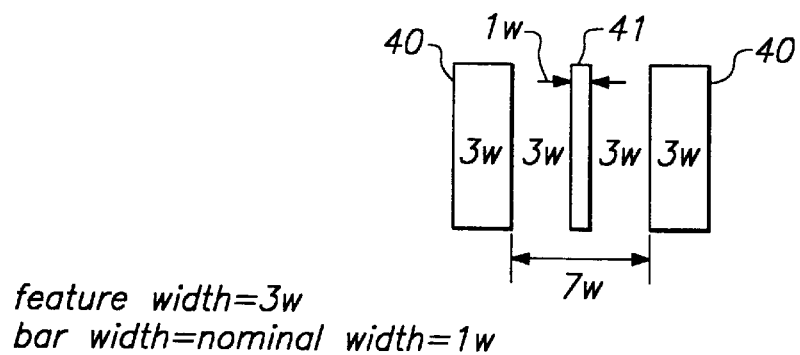
feature width=3w
bar width=nominal width=1w
FIG. 3 *(PRIOR ART)*
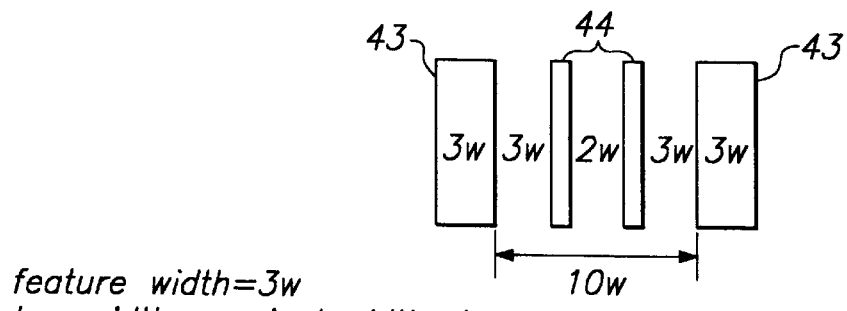
feature width=3w
bar width=nominal width=1w
FIG. 4 *(PRIOR ART)* feature width=3w
bar width=nominal width=1w
bar separation=2w feature width=3w
bar width<nominal (1w)

feature width=3w
bar width (w')<nominal width (1w)
bar separation=2w' feature width=3w
bar width=1w

OPTICAL PROXIMITY CORRECTION METHOD FOR INTERMEDIATE-PITCH FEATURES USING SUB-RESOLUTION SCATTERING BARS ON A MASK

FIELD OF THE INVENTION

The present invention relates to photolithography and in particular relates to proximity correction features used in photolithography.

BACKGROUND OF THE INVENTION

In the semiconductor industry, photolithography is used to transfer patterns corresponding to a circuit layout from a mask to a semiconductor wafer to form a semiconductor device. The layout, and hence the patterns on the masks, are designed to conform to dimensional rules determined by the lithographic processing parameters, semiconductor processing parameters, and circuit design criteria. Adhering to these layout design rules ensures that the patterns on the mask transfer properly to the semiconductor wafer and ensures circuit functionality. One important layout design rule which tends to determine the overall size and density of the semiconductor device defines the smallest width of a line or smallest space between two lines (often referred to as the critical dimension (CD)). Another critical design rule defines the minimum of the width of a given feature plus the distance to the adjacent feature edge as the minimum pitch.

Once the layout of the circuit is created, the photolithographic process utilizes an exposure tool to irradiate a layer of photoresist on the semiconductor wafer through a mask to transfer the pattern on the mask to the wafer. An important limiting characteristic of the exposure tool is its resolution limit. The resolution for an exposure tool is defined as the minimum feature that the exposure tool can repeatedly expose onto the wafer. As the critical dimensions of the layout approach the resolution limit of the lithography equipment, proximity effects begin to influence the manner in which features on a mask transfer to the resist layer such that the masked and actual layout patterns begin to differ. Proximity effects are known to result from optical diffraction in the projection system. This diffraction causes adjacent features to interact with one another in such a way as to produce pattern-dependent variations. The magnitude of the proximity effect on a feature depends on the feature's placement on the mask with respect to other features; the closer together features are, the more proximity effect is seen.

One specific proximity effect related problem occurs when features are designed to have the same dimension, but are placed in a different proximity to other features in a layout. Features that have edges that are in close proximity to other features (referred to as densely packed edges) are more affected by proximity effects while features that have edges that are relatively isolated (referred to as isolated edges) are less affected by proximity effects; as a result, a feature in dense context tends to be printed differently than an isolated feature.

Scattering bars (also referred to as intensity leveling bars and assist bars) have been developed in order to minimize or eliminate proximity effects between "isolated" and "densely packed" edges of features in a lithographic process. Scattering bars are correction features (typically non-resolvable) that are placed next to isolated edges on a mask in order to adjust the edge intensity at the isolated edge to match the edge intensity at a densely packed edge and thereby cause the feature having at least one isolated edge to have nearly the same width as features having densely packed edges. In U.S. Pat. No. 5,242,770 (assigned to the Assignee of the present application), intensity leveling bars (i.e. scattering bars) are described as having a nominal width and nominal placement from isolated edges for optimal proximity correction results. In addition, in this technique edges are either clearly isolated or are densely packed at the minimum spacing between edges. Moreover, this technique discloses placing a single scattering bar between two feature edges to simultaneously correct two edges separated by an intermediate distance. However, it does not take into consideration the full range of possible spacings between feature edges.

As is to be expected, the drive in circuit design is to reduce the size of the layout and hence final device size. Consequently, layouts are designed such that the majority of lines have minimum width and minimum pitch for the given lithographic processing parameters. However, it is typically not possible to design a layout in which all features have minimum widths and separation spacings. Consequently layout designs typically include features having 1) widths and separation spacings at or near the resolution limit of the lithographic process, 2) widths and separation spacings that are slightly greater than the resolution limit of the lithographic process, and 3) widths in the range of the critical dimension of the lithographic process that are far enough apart to avoid proximity interactions. Moreover, although the scattering bar technique disclosed by U.S. Pat. No. 5,242,770 is effective for controlling widths of features having edges that are clearly isolated, it becomes less effective for controlling dimensions of features that are separated a distance that is only slightly greater than the resolution limit of the lithographic process.

SUMMARY OF THE INVENTION

The present invention is a method of reducing the variations in feature dimensions in a lithographic process using scattering bars. The method of the present invention is based on the fact that scattering bars used according to previously established nominal design rules are not as effective in controlling feature dimensions for features that are separated by certain intermediate distances. Specifically, in the prior art, the nominal scattering bar width was held invariant, and the bar-to-feature separation was not allowed to fall below nominal. The present invention addresses several cases within these intermediate distances where there is insufficient space between features in the mask layout to fit a nominal-width scattering bar at the nominal distance from a feature's edge, but where some amount of correction is still required in order to maintain good feature dimension control. The present invention employs variations in scattering bar width, shape, and scattering bar-to-primary feature separation to better fit scattering bars between features that are separated by intermediate distances.

In the present invention, a method referred to as feature crowding is implemented in order to achieve variations in scattering bar-to-primary feature separation. The scattering bar-to-primary feature separation may vary both above and below the nominal separation, within limits. The minimum allowable separation (referred to as the absolute minimum crowding distance) is related to exposure wavelength. In one embodiment, the absolute minimum "crowding" distance is greater than or equal to 75% of the exposure wavelength. In an embodiment in which a mercury I-line exposure source is used in the lithographic process having a wavelength ($\lambda$) equal to 0.365 microns, this absolute minimum distance is in the range of 0.275 microns.

In a first technique of the present invention using feature crowding, a single scattering bar of a nominal width is placed between two features at a separation distance in the range of the absolute minimum crowding distance from each feature edge. In one embodiment, the nominal width is defined to be in the range of $\lambda/4$ to $\lambda/3$.

In a second technique of the present invention using feature crowding, two scattering bars each of a nominal width are separated from each of the two feature edges a distance between the absolute minimum distance and the nominal distance.

In a third technique of the present invention, the width of the scattering bar is reduced from nominal while crowding scattering bars between edges. Hence in this case, the scattering bar or bars are separated a distance as little as the absolute minimum crowding distance and have a width that is less than nominal. Reduced-width scattering bars, while less effective for controlling isolated feature dimensions, are appropriate in moderately crowded spacings where less correction is required. In one embodiment of the present invention, the crowded scattering bar width can be reduced by a factor of two. In the case of a lithographic process using an exposure wavelength ($\lambda$) equal to 0.365 microns, scattering bars can be reduced to a width of 0.06 microns or to $\lambda/6$.

Alternatively, in a fourth technique of the present invention, a scattering bar may be embodied as a nominal-width dashed-line. The dashed-line effectively reduces the width of the scattering bar therein having a similar affect as the reduced-size scattering bar. Similar to the reduced-size scattering bar, the dashed scattering bar has the effect of allowing for more feature crowding than a solid nominal scattering bar technique of the present invention.

In a fifth technique of the present invention, a scattering bar that is wider than nominal is used when features are separated a distance that is greater than the nominal single scattering bar separation distance but less than the nominal double scattering bar separation distance. Where a nominal scattering bar has a width less than $\lambda/3$ (such as $\lambda/4$), the scattering bar width according to the fifth technique of the present invention can be increased from the nominal up to near $\lambda/3$ in the bar crowding case and still remain unresolved in the photoresist.

In a sixth technique of the present invention, the placement of adjacent edges of the primary features is adjusted to either increase or decrease the space between the adjacent edges so that a nominal-size, a reduced-size, an increased-size, or a dashed-line scattering bar may be placed in the adjusted space between the primary features to achieve feature crowding.

BRIEF DESCRIPTION OF THE DRAWINGS

FIG. 2A illustrates the use of scattering bars on isolated edges in accordance with U.S. Pat. No. 5,242,770.

FIG. 3 illustrates two features spaced so as to allow placement of a single nominal-width scattering bar having a nominal spacing from the feature edges in accordance with prior art methods.

FIGS. 4 illustrates two features spaced so as to allow placement of two nominal-width scattering bars with nominal spacing from the feature edges in accordance with prior art methods.

DETAILED DESCRIPTION

The present invention is a method of using scattering bars between features for correcting for proximity effects when features are spaced such that conventional scattering bar spacing cannot be achieved. In the following description, numerous specific details are set forth in order to provide a thorough understanding of the present invention such as exposure wavelength, lithographic parameters and techniques, etc. It will be apparent, however, to one skilled in the art that these specific details need not be employed to practice the present invention. In other instances, other well-known lithographic processing steps have not been described in detail in order to avoid unnecessarily obscuring the present invention.

One type of proximity effect seen in lithographic processing is that features having the same dimensions on a mask transfer differently than other features (i.e., have different dimensions) depending on their proximity (i.e. relatively isolated or densely packed) to other features. This proximity effect is due to the diffraction that occurs between feature edges that are relatively close. U.S. Pat. No. 5,242,770 discloses a technique for reducing this disparity by placing non-resolvable additional bars, referred to as scattering bars or intensity leveling bars, next to isolated edges of features such that features having isolated edges and features having densely packed edges transfer approximately the same if their original mask dimensions are the same. Scattering bars match the intensity profile of the edges of relatively isolated features to that of relatively dense features, providing significantly better dimensional control as feature spacing varies. They achieve this by increasing the intensity gradient of the feature edges, resulting in sharper edge profiles and hence improve depth-of-focus.

Figure 1A:
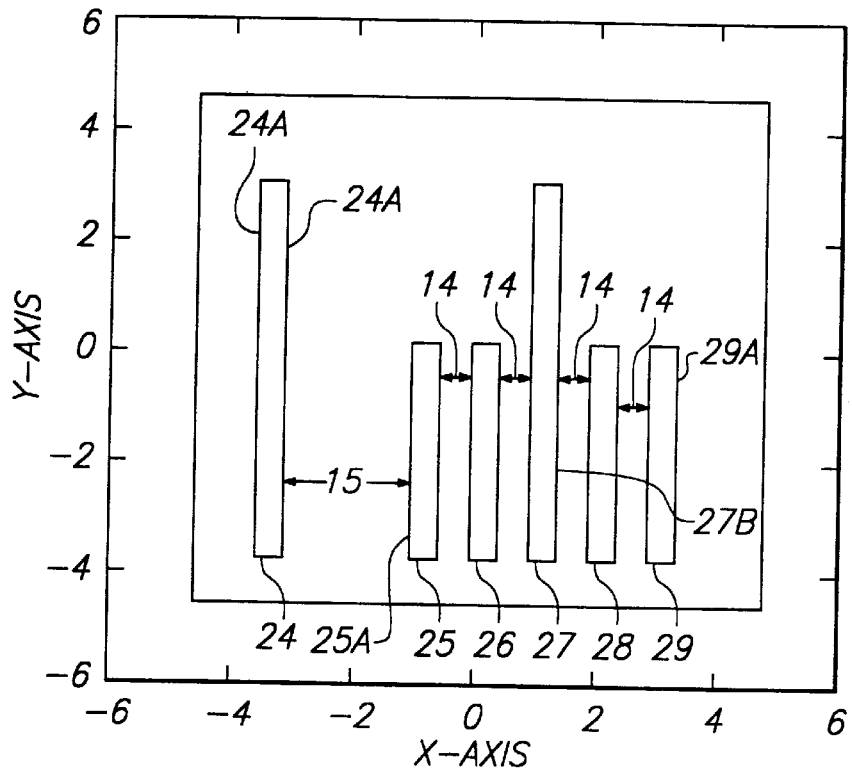
FIGS. 1A and 1B illustrate a conventional densely packed primary feature edge and isolated primary feature edge and corresponding intensity gradients at these edges.
Figure 1B:
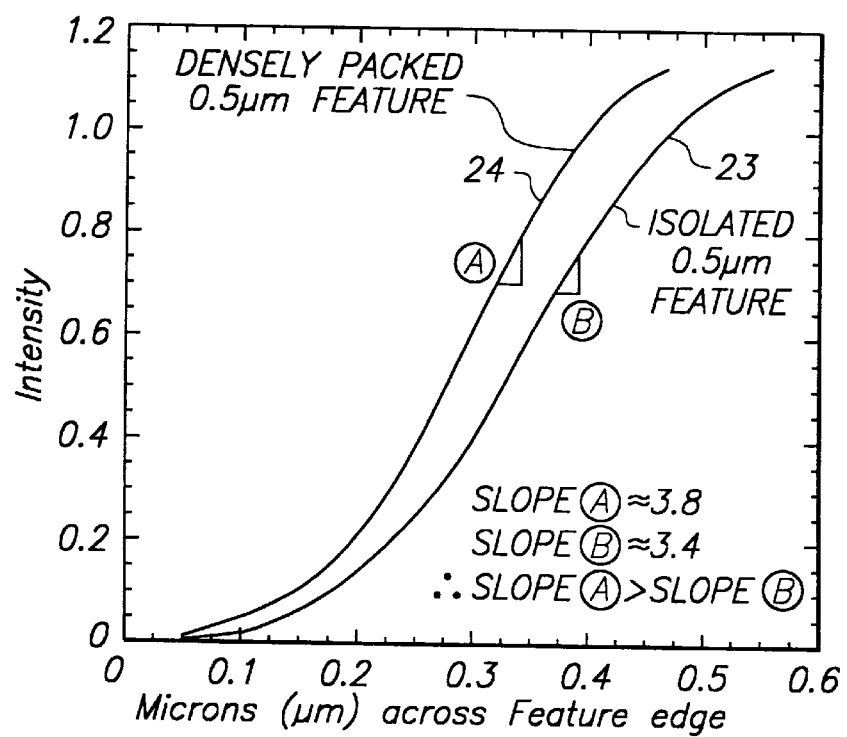
Figure 2B:
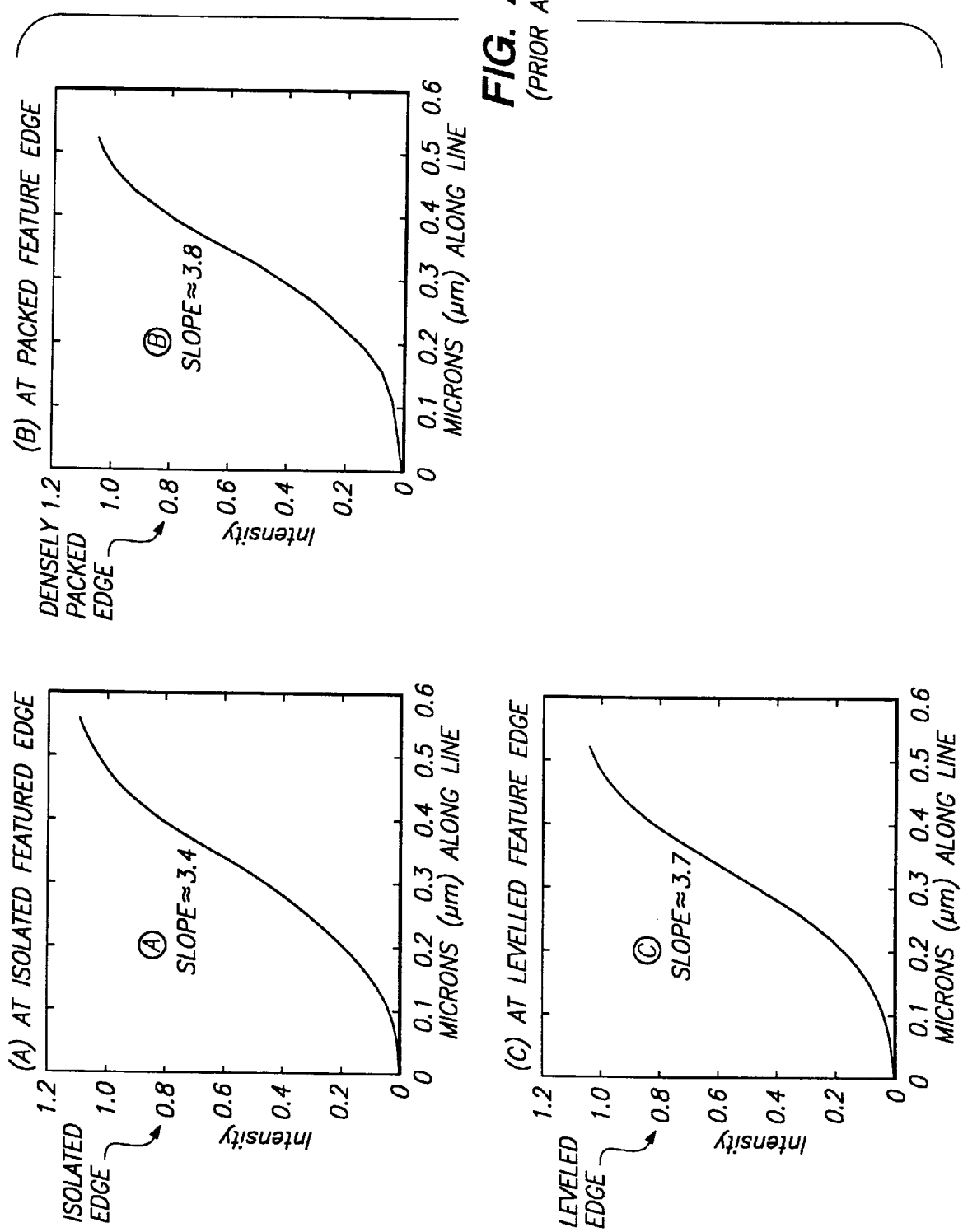
FIG. 2B illustrates the corresponding intensity gradients for the feature edges shown in FIG. 2A.

FIG. 1A shows features 24–29 having edges that are densely packed (edges 14) and isolated (edges 24A, 25A, and 29A) according to U.S. Pat. No. 5,242,770. FIG. 1B shows how the edge gradient (change in exposure light intensity per unit distance) of the densely-packed edges (curve A) in FIG. 1A is greater than the edge gradient of the isolated edge (curve B) due to proximity effects between the densely packed edges. FIG. 2A illustrates the use of scattering bars on isolated edges in accordance with U.S. Pat. No. 5,242,770. FIG. 2A illustrates features 30 –34, and particularly feature 32 which has an isolated edge 32A, a densely-packed edge 32B, and a corrected edge 32C having scattering bar 36 adjacent to it. FIG. 2B illustrates the effect of scattering bar 36 on an isolated edge by showing that the edge gradients of densely packed edge 32B and corrected edge 32C are approximately the same whereas isolated edge 32A is less than both.

According to U.S. Pat. No. 5,242,770 scattering bars have a nominal/preferred width which according to this technique was empirically determined to be ⅕ the critical dimension of the lithographic process and a preferred spacing from edges (also empirically determined) of 1.1 times the critical dimension (for clear field masks). In subsequent empirical tests, it has been determined that the maximum permissible scattering bar width is roughly equal to ⅓ the wavelength of the exposure source. Using, as an example, the 365 nanometer (or 0.365 micron) wavelength of a conventional mercury I-line emission exposure source currently used in the lithographic technology, the nominal scattering bar width is chosen to be 0.1 microns. However, the maximum permissible scattering bar width such that the scattering bars remain unresolvable can be up to or near 0.125 microns. Since this scattering bar width setting is related to the exposure source wavelength, the following is defined:

nominal scattering bar width=w where, w≦⅕ exposure source wavelength ($\lambda$).

For the following discussion, w is selected to be 0.1 microns and the nominal scattering bar-to-feature separation is 3 w. It should be noted that all dimensions cited in the following discussion are wafer scale, independent of reduction occurring in the printing process.

FIG. 3 shows two features 40 that are spaced apart a distance which allows the placement of a single nominal-width (i.e. 1 w) scattering bar 41 having a nominal separation (3 w) from each of the two feature edges. In this case a single scattering bar simultaneously provides correction for two feature edges. As shown, in order to place a nominal-width scattering bar between two edges in this example in accordance with this prior art technique the edges must be at least 7 w apart, (i.e. a 1 w scattering bar placed 3 w from each edge of the two feature edges).

FIG. 4 shows features 43 having edges that are spaced far enough apart to fit two nominal-width scattering bars 44 between the features at nominal distances from each edge. Note that it was empirically determined that the minimum allowable distance between two scattering bars is approximately 2 w for this example. This is the distance that ensures that scattering bars do not interact and begin to develop in the resist pattern. Consequently, in order to fit two nominal-width scattering bars between the two feature edges at nominal spacing from each edge, the features must be separated by a distance of 10 w. Under these two conditions, the edge intensity gradient of the adjacent edges of features 43 and 40 are found to closely resemble the gradient of a densely packed edge.

Although, U.S. Pat. No. 5,242,770 discloses a method of providing scattering bars adjacent to feature edges when features are clearly isolated or in the case in which features are spaced so as to allow a nominal single scattering bar having nominal edge spacing (FIG. 3) or two nominal scattering bars having nominal spacing (FIG. 4) it does not address considerations in applying scattering bars to adjacent features having edges that are separated by intermediate distances other than these optimal spacing cases.

Figure 5:
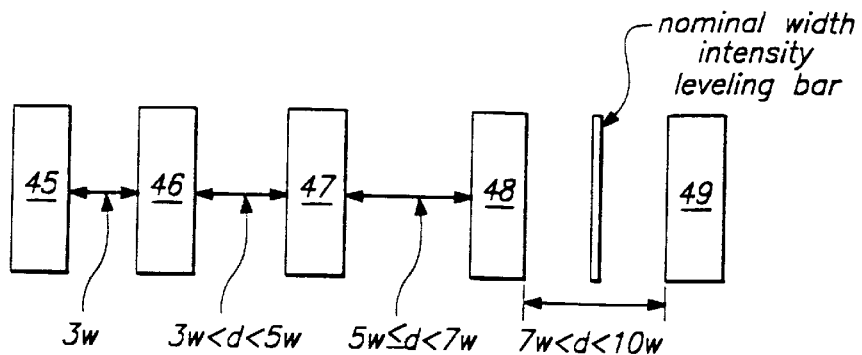
FIG. 5 illustrates the different separation distances between two features and prior art use of scattering bars.

FIG. 5 illustrates features having various separation distances and the application of scattering bars with respect to these separation distances in accordance with the prior art method. Densely packed features 45 and 46 are separated a distance equal to 3 w. In this case, the adjacent edges do not need a scattering bar in accordance with the prior art method. Features 46 and 47 are separated a distance greater than 3 w and less than 5 w (i.e., 3 w<d<5 w). In this case, the adjacent edges "lithographically behave" as densely packed edges and variations in feature size are tolerable without correction. Features 47 and 48 are separated a distance at least 5 w but less than 7 w (i.e., 5 w≦d<7 w). In this separation case, the adjacent edges of features 47 and 48 begin to behave as isolated edges. In fact, it was determined that the optical proximity effect between two adjacent edges diminishes rapidly after the spacing between them exceeds 1.5 $\lambda$. However, as indicated above, the placement of a nominal-width, nominally-spaced scattering bar (in accordance with the prior art method) is not possible until features are separated a distance of 7 w. When features are spaced the nominal distance of 7 w (shown in FIG. 3), a single scattering bar may be placed between two adjacent features. In this case optimal proximity correction is achieved according to the prior art method. Features 48 and 49 are separated a distance greater than 7 w but less than 10 w. In this case, a scattering bar may be centered between the adjacent feature edges in accordance with the prior art method, however the scattering bar is no longer spaced the nominal distance from each of the adjacent edges of features 48 and 49. As a result, the scattering bar becomes less effective when features are separated in this distance range. Finally when features are separated a distance of 10 w or more apart (shown in FIG. 4), two nominal-width, nominally-spaced scattering bars can be placed between the adjacent features.

Figure 6:
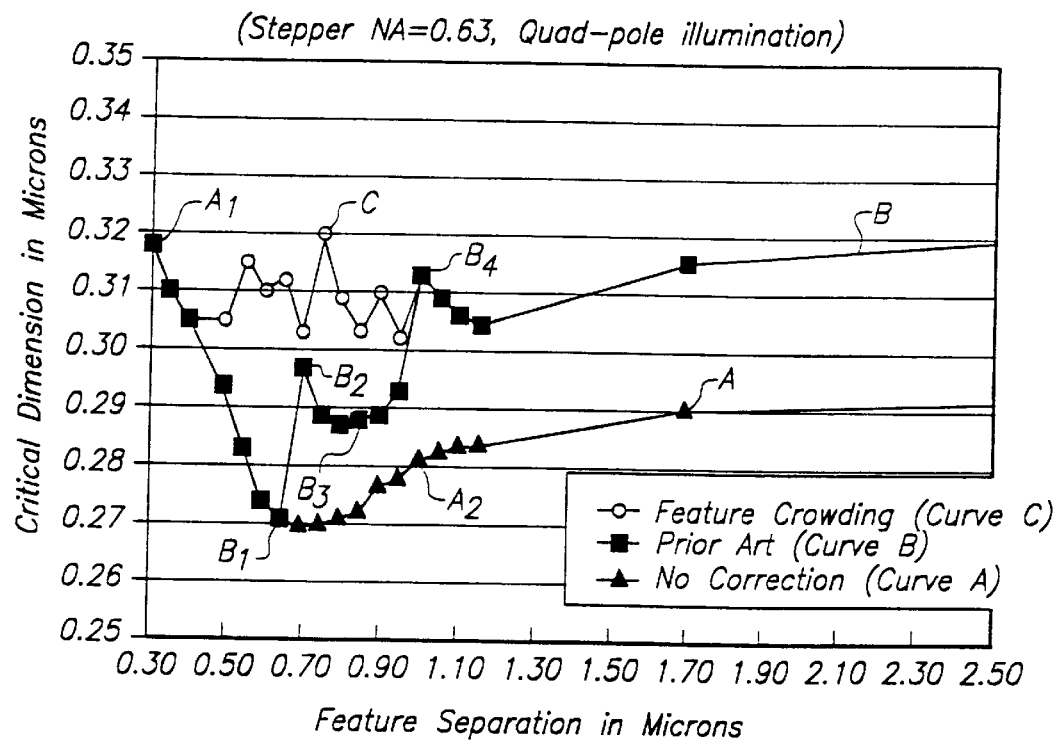
FIG. 6 shows a graph illustrating feature separation distance vs. feature dimension for a lithographic process: 1) not using scattering bars, 2) using scattering bars according to prior art methods, and 3) using scattering bars according to the methods of the present invention.

FIG. 6 illustrates the relationship between feature width (as printed) and feature separation for mask features without scattering bars (A), mask features in which scattering bars are applied in accordance with the prior art method (B), and mask features in which scattering bars are applied in accordance with the methods of the present invention (C) (note: all mask features have the same width).

As described above, features that are not proximity effect corrected with scattering bars on the mask have width dimensions that depend on their proximity to other features. For features that are densely packed (features 45 and 46, FIG. 5), that is, when their separation approaches the critical dimension of the lithographic process, (a separation of 0.3 microns in FIG. 6), widths are in the range of 0.32 microns (indicated by A1, FIG. 6). Features that have a pitch of infinity (i.e., feature separation greater than 1.0 microns, indicated by A2 in FIG. 6) have widths that are less than the densely packed feature (0.29 microns) since they do not interact with any adjacent features. Features that are in the intermediate separation range (0.3 microns to 1.0 microns) have widths that are even less than both the densely packed features and the isolated features with no proximity correction.

The widths of features with proximity correction according to the prior art method are more consistent but still vary considerably for features that are spaced at the intermediate feature separations. Referring to FIG. 6, when features are separated a distance of 0.3 microns <d<0.5 microns (features 46 and 47, FIG. 5) with no scattering bar between, adjacent edges still behave as densely packed edges and the proximity effect is strong enough so that features separated by a distance in this range still have dimensions close to densely packed features. As edge separation increases, the interaction between adjacent edges decreases, and feature dimensions slightly decrease. When adjacent feature edges are separated a distance of $5\ w \leq d < 7\ w$ (features 47 and 48, FIG. 5) the adjacent edges begin to behave as isolated edges and feature dimensions can significantly vary (indicated by B1, FIG. 6). When features are spaced at approximately 0.7 microns, a single scattering bar having a nominal width is placed between the features edges at a nominal distance and again feature dimensions approach that of densely packed features (B2, FIG. 6). When features are separated a distance of $7\ w < d < 10\ w$ (features 48 and 49, FIG. 5) the single scattering bar begins to lose effectiveness and once again a change in feature dimensions occurs (B3, FIG. 6) with respect to densely packed features. Finally, when features are separated a distance of $d \geq 10\ w$ (B4, FIG. 6), double scattering bars having a nominal width are placed at a nominal spacing from edges so that feature edges again behave as densely packed edges. In consideration of the variations in dimensions that occur when features are separated an intermediate distance of $5\ w \leq d < 7\ w$ or $7\ w < d < 10\ w$ with respect to densely spaced features and with respect to features that effectively can use scattering bars in accordance with the prior art method, these feature separations tend to be avoided thereby reducing circuit design flexibility. The net effect illustrated in FIG. 6 is that in a lithographic process using conventional scattering bars, features that are separated a distance of $5\ w \leq d < 7\ w$ and $7\ w < d < 10\ w$ will transfer considerably differently when compared to other features having the same mask dimensions. Curve C shows the effect of performing the scattering bar method of the present invention on the intermediately spaced features as will be described below in detail.

It should be noted that the above described break points (e.g., 5 w, 7 w, 10 w) are not precise and may vary slightly due to other processing variations.

The present invention is a method of reducing the loss of dimension control of features in the above described feature separation cases. The method is based on the empirical observation that due to the non-resolvable size of the scattering bar, design rules that are different than resolvable feature design rules can be applied to the scattering bars. Specifically, whereas design rules prescribe that resolvable features be spaced a distance greater than or equal to the critical dimension of the lithographic process, scattering bars according to the present invention can be placed next to a feature edge at an absolute minimum "crowding" distance that is less than the critical dimension of the lithographic process. In fact, it was determined that the absolute minimum "crowding" distance is related to the wavelength of the exposure tool and not the critical dimension of the lithographic process like the previous nominal scattering bar (intensity leveling bar) spacing disclosed by U.S. Pat. No. 5,242,770.

In the general feature crowding method of the present invention, a scattering bar or two bars of nominal width is/are placed between two feature edges separated a distance of $5\ w \leq d < 7\ w$ and $7\ w < d < 10\ w$ respectively. The scattering bars are spaced a distance that is greater than the absolute minimum crowding distance from each edge of the two features but less than the nominal distance.

Figure 7:
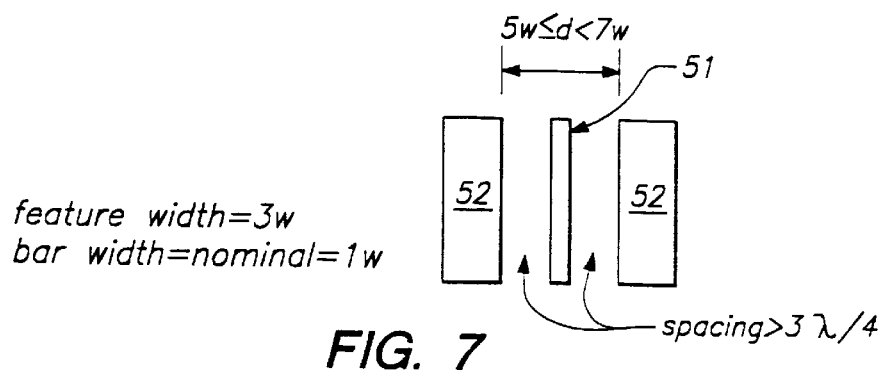
FIG. 7 illustrates utilizing scattering bar crowding for features that are separated a distance of $5\ w \leq d < 7\ w$ in accordance with a first technique of the present invention.
Figure 8:
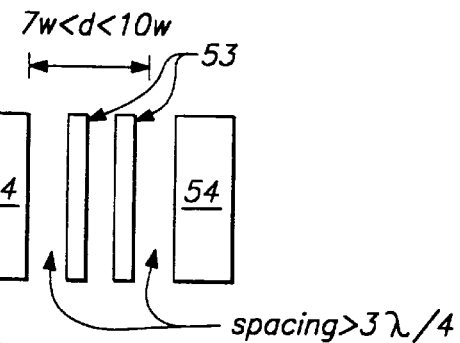
FIG. 8 illustrates utilizing scattering bar crowding for features that are separated a distance of $7\ w < d < 10\ w$ in accordance with a second technique of the present invention.

FIG. 7 illustrates utilizing feature crowding in the case in which adjacent features are separated a distance of $5\ w \leq d < 7\ w$. A scattering bar 51 having a nominal width (1 w) is centered between the two features 52 at a distance greater than the absolute minimum crowding distance from each edge of the two features but less than the critical dimension. FIG. 8 illustrates utilizing scattering bar crowding when adjacent features are separated by $7\ w < d < 10\ w$. In this case, two scattering bars 53 having a nominal width (1 w) are placed between features 54. As with the first technique, scattering bars 53 are spaced from each of the two feature edges a distance in the range of the absolute minimum distance. Furthermore, the scattering bars are spaced apart a nominal distance of 2 w so as to ensure that they do not begin to resolve in the photoresist.

In one embodiment of the present invention, the absolute minimum "crowding" distance is greater than or equal to 75% of the exposure wavelength and less than the critical dimension. In an embodiment in which a mercury I-line exposure source is used in a lithographic process having a wavelength equal to 0.365 microns, this absolute minimum distance is in the range of 0.275 microns.

Figure 9:
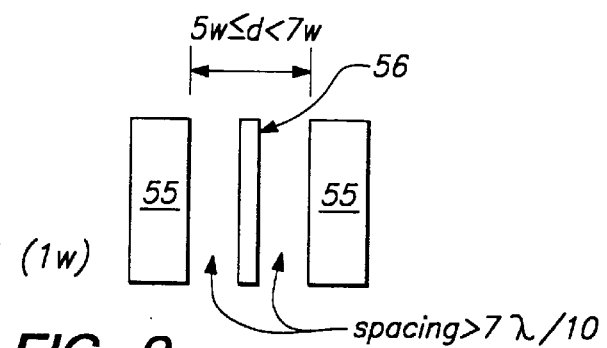
FIGS. 9 and 10 illustrate utilizing scattering bar crowding in accordance with the present invention in which reduced-width scattering bars are utilized.
Figure 10:
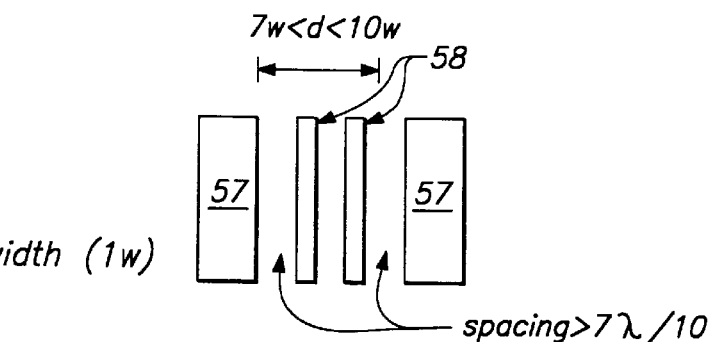

As described above, since scattering bars are sub-resolution features they lithographically do not need to adhere to the same design rules as resolvable features. As a result, it was determined that in a third technique of the present invention, the width of the scattering bar can be reduced in addition to crowding scattering bars between edges. FIG. 9 illustrates two features 55 having a scattering bar 56 between them in which the bar has a width that is less than nominal and is spaced in the range of the absolute minimum crowding distance from the feature edges. FIG. 10 illustrates two features 57 spaced apart a distance of $7\ w < d < 10\ w$ and having two scattering bar features 58 between them. Scattering bars 58 have widths that are less than nominal (i.e., reduced-width) and are each spaced in the range of the absolute minimum crowding distance from the feature edges. It was determined that although reduced-width scattering bars are not very effective for controlling feature dimensions at a nominal scattering bar spacing, reduced-width scattering bars are more effective when used in a highly crowded setting such as shown in FIG. 9 and 10. Using reduced-width scattering bars allows for features to be even more crowded, thereby providing dimension control over a wider range of separations.

Figure 11:
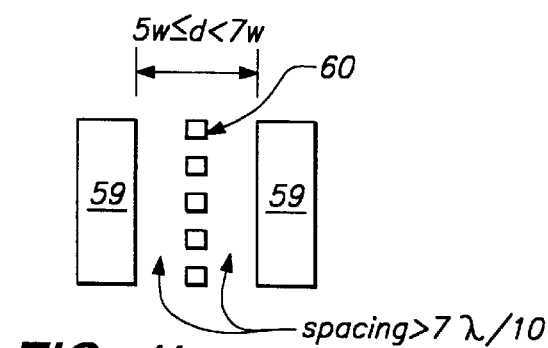
FIGS. 11 and 12 illustrate utilizing scattering bar crowding in accordance with the present invention in which scattering bars are embodied as dashed lines.
Figure 12:
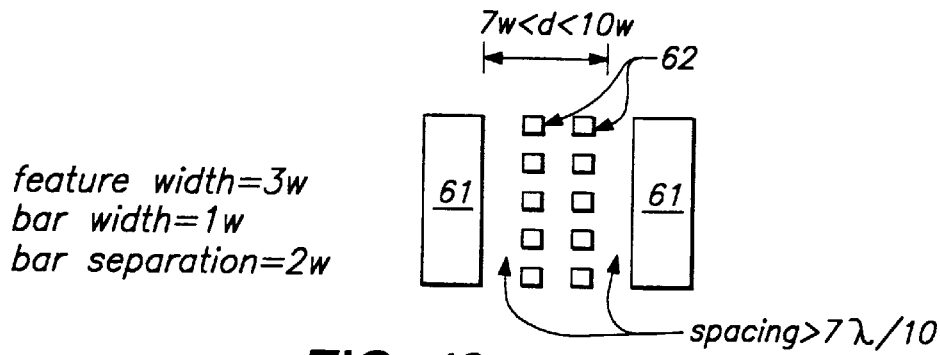

In the fourth technique, a dashed scattering bar is used for proximity correction while feature crowding (FIGS. 11 and 12). This technique is an alternative to the reduced-size scattering bar described in the third technique as shown in FIGS. 9 and 10.

The purpose of using a dashed scattering bar is to reduce the effective width of the bar without reducing the physical width of the bar on the mask. This is a technique well known in the art and is referred to as halftoning. There are two variable features of dashed bar which need to be selected in order to obtain optimal proximity correction using the dashed bars: the ratio of the dash length to the dash separation, which controls the effective width of the bar, and the dash pitch (i.e., the sum of the dash length and dash separation). A very fine dash pitch presents mask manufacturability limitations. An overly large dash pitch causes the scattering bar to loose its halftone properties, resulting in a distortion of the primary feature.

The main benefit of using the dashed scattering bar as opposed to the reduced-size scattering bar is that the dashed bar maintains a nominal width. This width is wider than the reduced-size bar and hence is generally easier to produce in the mask making process. In one embodiment a 1-to-1 ratio of dash-length versus dash-separation is used. For a stateof-the-art mask inspection that uses visible light as its illumination source, the optimized dash period is around 0.32 microns. This translates to 0.16 microns in dash length and dash separation. Converting to a 5 X mask dimension, this represents a 0.8 micron dash line and space on the mask.

Figure 13:
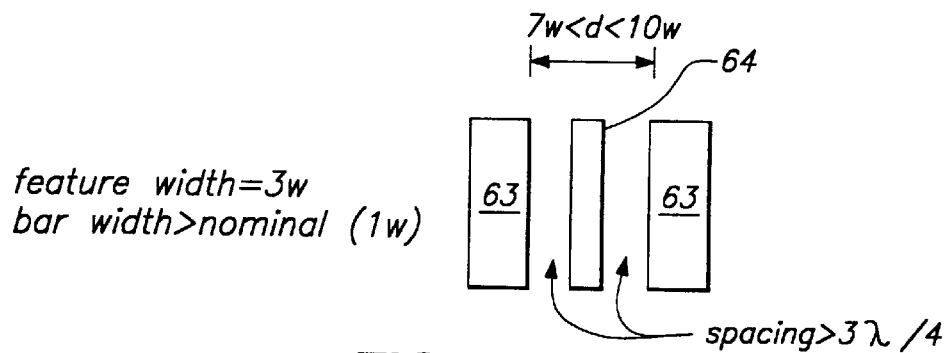
FIG. 13 illustrates two features having a wider than nominal-width scattering bar between them that is spaced in the range of the absolute minimum crowding distance from feature edges in accordance with the fourth technique of the present invention.

In a fifth technique, a scattering bar that is wider than the nominal scattering bar is used when features are separated a distance of 7 w<d<10 w such that a single scattering bar becomes ineffective but nominal double bars do not fit. FIG. 13 shows two features 63 separated a distance of 7 w<d<10 w having a wider scattering bar 64 between them. The scattering bar width according to the fifth technique of the present invention can be increased from the nominal width up to the maximum allowable width of around λ/3 in the crowding case, and the scattering bar remains un-printable.

The sixth technique of the present invention is one in which the placement of the primary feature adjacent edges are adjusted so as to perform feature crowding while using one of a nominal-width, a reduced-width, an increased-size or a dashed-line scattering bar.

Figure 14:
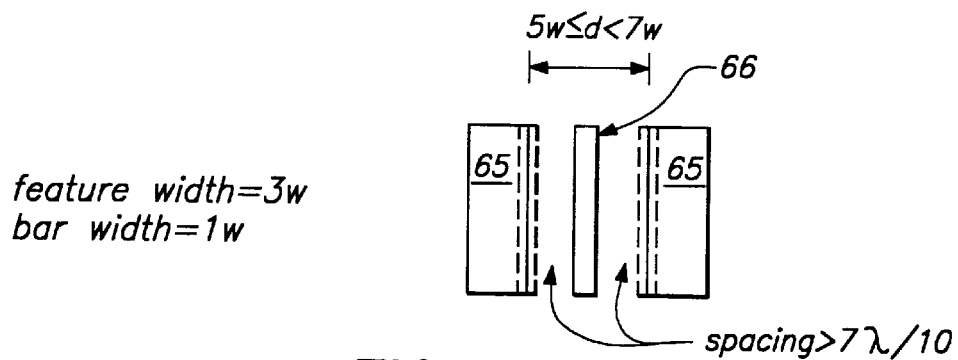
FIGS. 14 and 15 illustrate utilizing scattering bar crowding in accordance with the present invention in which placement of feature edges are adjusted.
Figure 15:
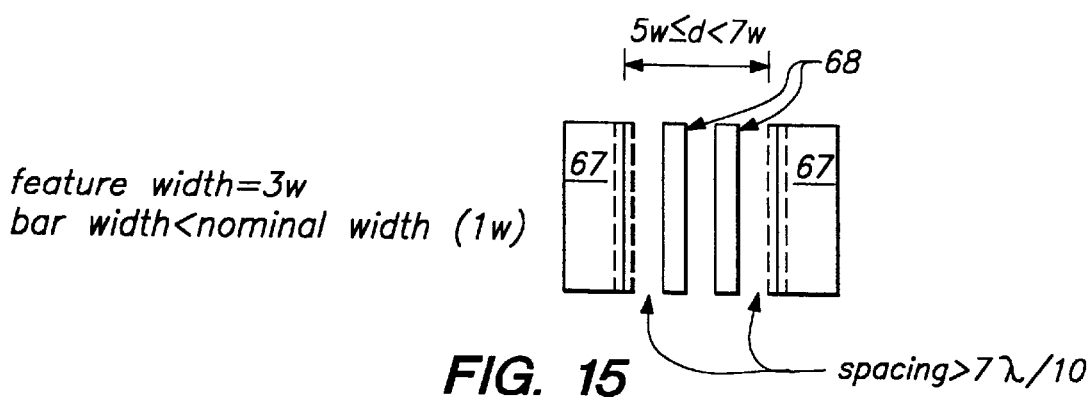

The technique is particularly applicable for correction of much tighter pitch features. In order to maintain the minimum required scattering bar to feature edge separation in the tighter pitch case, the primary feature edge is adjusted back thereby providing a greater separation between adjacent edges. In the case in which a smaller separation between adjacent edges is desired, the edges are moved closer together. Furthermore, one or both edges may be adjusted. Adjusting the placement of edges is dependent upon the CAD grid and the E-beam mask writing spot size. A 0.2 w trimming per feature edge is very reasonable if the process uses a 0.1 micron E-beam writing spot size on a 5 X reticle. After trimming the primary feature edges, the feature separation will be 0.4 w wider. This opens up a possibility for crowding either a nominal-size or a reduced-size scattering bar in the tight separation. FIGS. 14 and 15 illustrate adjusting feature edges in accordance with the feature crowding technique of the present invention.

It should be understood that the third, fourth, fifth and sixth techniques can be combined and used with the first two techniques to compensate for the limitations presented by the wavelength effect in the feature crowding technique.

Table 1 shows feature dimension vs. correction technique used which include: 1) no correction, 2) prior art correction and 3) present invention correction using feature crowding. Table 1 illustrates that different techniques according to the present invention are more effective for certain intermediate separation distances than others. To get the best proximity correction, all techniques can be used and/or combined. Due to the discrete nature of the pitch dimension in a typical IC design, it is possible to first identify these various intermediate pitches and then apply each one of the correction methods according to the present invention one-by-one until the best results are attained.

Table 1 compiles the measured critical dimension data for various pitch dimensions using an I-line stepper with 4-pole off-axis illumination, at best focus.

TABLE 1

| Feature Pitch | Feature Separation | No Correction | Prior Art Correction | Present Invention | Feature Crowding Correction ||||||| 
|---|---|---|---|---|---|---|---|---|---|---|---|
| | | | | | Method (1) | Method (2) | Method (3) | Method (4) | Method (5) | Method (6) | Method (7) |
| 0.60 | 0.30 | 0.318 | 0.318 | 0.318 | Densely Packed Features ||||||| 
| 0.65 | 0.35 | 0.310 | 0.310 | 0.310 | (no feature correction) ||||||| 
| 0.70 | 0.40 | 0.305 | 0.305 | 0.305 | | | | | | | |
| 0.75 | 0.45 | 0.300 | 0.300 | 0.300 | | | | | | | |
| 0.80 | 0.50 | 0.294 | 0.294 | 0.305 | | | | | | | 0.305 |
| 0.85 | 0.55 | 0.283 | 0.283 | 0.315 | | | | | | 0.315 | |
| 0.90 | 0.60 | 0.274 | 0.274 | 0.310 | | | 0.310 | 0.304 | | | |
| 0.95 | 0.65 | 0.271 | 0.271 | 0.312 | 0.312 | | | | | | |
| 1.00 | 0.70 | 0.270 | 0.297 | 0.303 | | | | | 0.303 | | |
| 1.05 | 0.75 | 0.271 | 0.289 | 0.320 | | | 0.320 | | | | 0.294 |
| 1.10 | 0.80 | 0.272 | 0.287 | 0.309 | | | 0.309 | | | | 0.290 |
| 1.15 | 0.85 | 0.273 | 0.288 | 0.303 | | | 0.303 | 0.319 | | | 0.290 |
| 1.20 | 0.90 | 0.277 | 0.289 | 0.310 | | | 0.299 | 0.310 | | | 0.293 |
| 1.25 | 0.95 | 0.278 | 0.293 | 0.302 | | 0.328 | 0.297 | 0.302 | | | |
| 1.30 | 1.00 | 0.281 | 0.313 | 0.313 | Nominal Scattering Bar Separation ||||||| 
| 1.35 | 1.05 | 0.283 | 0.309 | 0.309 | (prior art) ||||||| 
| 1.40 | 1.10 | 0.284 | 0.306 | 0.306 | | | | | | | |
| 1.45 | 1.15 | 0.284 | 0.305 | 0.305 | | | | | | | |
| 2.00 | 1.70 | 0.290 | 0.316 | 0.316 | | | | | | | |
| 3.00 | 2.70 | 0.292 | 0.320 | 0.320 | | | | | | | |
| 10.00 | 9.70 | 0.292 | 0.319 | 0.319 | | | | | | | |
| 3 Sigma CD Spread | | 0.041 | 0.044 | 0.019 | | | | | | | |
| Max–Min CD Delta | | 0.048 | 0.049 | 0.020 | | | | | | | |

The first column of the Table is the feature pitch. The second column is the feature separation. The third and fourth columns represent the results from no proximity correction and from the prior art correction method respectively. The fifth column incorporates the best results from the present feature crowding methods. The next seven columns display the results, where applicable, from each of the seven techniques according to the present invention.

At the bottom of the third, fourth, and fifth columns, two additional comparisons are made. One is the spread of the critical dimension over pitch and the other one is the critical dimension delta between the maximum and the minimum over pitch. As can be seen, although the prior art has significantly reduced critical dimensional difference between the very dense (separation less than 4 w or 0.4 microns) and the relatively isolated (separation greater than 10 w or 1 micron) cases, the total critical dimension spread over pitch remains nearly unchanged. However, both the delta and the spread are reduced by more than half with the present invention. The data shown in column 5 represents the feature dimensions of the most effective methods according to the present invention that was used. FIG. 6 (curve C) shows a plot of this data.

The effect of implementing scattering bars in accordance with the present invention shown in FIGS. 7 and 8 is shown as methods 1 and 2 in the sixth and seventh column respectively. As shown in Table 1 these techniques are particularly applicable to the separations of 0.65 microns and 0.95 microns.

Column 8 indicates the results of using a reduced-size scattering bar width. Since the width is reduced, this technique can be applied to more feature separation cases. In the case of Table 1 the scattering bar width is reduced to a width of 0.06 microns. For a 5 X reticle, a width of 0.06 microns translates to 0.3 microns on the mask. The eighth and ninth columns of the Table 1 illustrate the results of the dashed scattering bar technique.

Column ten of Table 1 shows the effect of using the increased-size scattering bar. This technique is particularly applicable for slightly above-wavelength design rules. Finally, the last two columns of Table 1 illustrate the effects of using the trimming technique of the present invention.

It should be understood that the prior art method using nominal widths and spacing was based on using the critical dimension of the lithographic process. It was not based on bar widths and spacings which are directly related to the wavelength of the exposure source. The critical dimension designated by IC design rules refers to the resolution limit of the IC process. In order to ensure a reasonable production yield, process design rules define a critical dimension that prevents the circuit layout from going beyond the limit of the lithographic process's capability. The process resolution limit (R) can be expressed by the following (Rayleigh Criterion):

$$R = k_1(\lambda)/NA$$

where R is the process resolution limit;

$k_1$ is the process capability factor;

$\lambda$ is the wavelength of the exposure source;

NA is the numerical aperture of the lens for the exposure tool;

Here, the constant "$k_1$" represents a factor of the lithographic process capability. This factor represents the effect of the photoresist process, inefficiency of the imaging optics of the exposure tools, settings of the illumination optics, wafer substrate influence, pattern transfer quality of the reticle used, and other miscellaneous variables found for the lithographic process. Smaller values of "$k_1$" indicate better process resolution. A small "$k_1$" results in a small "R" (i.e. resolution) for a given exposure tool ($\lambda$/NA). It is common practice in the field of IC design to take the "R" value as the critical dimension.

For instance, if an exposure tool uses a mercury I-line illumination source ($\lambda$=0.365 microns) with NA equal to 0.54, and the process capability $k_1$ factor is 0.75, then the most advanced design for this process will have a critical dimension at near 0.50 microns. In this case, the critical dimension is larger than the exposure wavelength (0.365 microns). This example represents a state-of-the-art process of the recent past.

For a critical dimension larger than the exposure-wavelength, it is practical to use the critical dimension as the "minimum" distance when considering the placement of the scattering bars. This was the basis applied in the U.S. Pat. No. 5,242,770.

Currently, due to technological advances, the process capability factor "$k_1$" has been reduced resulting in a process resolution limit (R) of less than the exposure wavelength.

While it may be possible to design an IC with a "critical dimension" in the sub-wavelength range, this has not become common practice as of yet mainly because proximity effects are more apparent in IC patterns designed at or below exposure wavelength. As a result, although it is possible to design IC's with critical dimensions less than the wavelength of the exposure tool, due to proximity effects seen at these dimensions, current semiconductor manufacturers tend to limit the critical dimension to at or above the exposure wavelength.

For performing proximity correction for a critical dimension that is well above the exposure wavelength as is done in the prior art, such as at the 0.5 micron level, the critical dimension in the design rule provides a "safe" manufacturing reference. However, for proximity correction at or below the exposure wavelength, as taught by the present invention, the exposure wavelength is used as the base line reference rather than the critical dimension. Hence, the absolute minimum crowding distance in accordance with the present invention is related to the wavelength of the exposure tool rather than the critical dimension of the lithographic process. Furthermore, as described above, it is a smaller dimension than the critical dimension. As a result, placing scattering bars a distance greater than or equal to this absolute minimum distance from feature edges in accordance with the method of the present invention, allows greater flexibility in bar placement and permits the use of scattering bars in cases where the prior method did not.

Although the elements of the present invention have been described in conjunction with certain embodiments, it should be apparent that the invention may be implemented in a variety of other ways. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

What is claimed is:

1. A method of providing non-resolvable correction features on a mask for correcting for proximity effects, said mask including at least two feature edges, said correction features having an associated nominal width, associated nominal spacing from a given mask feature edge, and an associated nominal spacing between adjacent correction feature edges, said method comprising the steps of:

adding a single non-resolvable correction feature between two adjacent mask edges on a mask, said correction feature having an edge adjacent to each of said two adjacent mask edges, wherein said adjacent correction feature edges are spaced a distance from said two adjacent edges that is less than said nominal spacing but greater than a given minimum distance;

adding two non-resolvable correction features between two adjacent edges on a mask wherein said correction feature is spaced a distance from each of said two adjacent edges that is less than said nominal spacing but greater than a given minimum distance.

2. The method described in claim 1 wherein said mask is used in a photolithographic process having an exposure source having an associated wavelength and wherein said minimum distance is proportional to said wavelength.

3. The method described in claim 2 wherein said given minimum distance is ¾ said wavelength.

4. The method described in claim 1 wherein said single correction feature has an associated width that is less than said nominal width.

5. The method described in claim 4 wherein said associated width of said single correction feature is ⅔ of said nominal width.

6. The method described in claim 1 wherein said associated width of said single correction feature is greater than said nominal width.

7. The method described in claim 6 wherein said associated width of said single correction feature is 1.5 of said nominal width.

8. A method of applying at least one correction feature having associated physical characteristics to correct for proximity effects of two adjacent primary features spaced apart a given distance in a lithographic process using an exposure tool having an associated wavelength and having an associated resolution limit which is dependent on processing parameters of said lithographic process, said primary features each having an associated edge adjacent to said at least one correction feature and said each adjacent edge having an original placement, said method comprising the steps of:

placing said at least one correction feature between said two adjacent features;

adjusting at least one of said associated physical characteristics of said at least one correction feature and said original placement of at least one of said adjacent edges so that the separation space between said each adjacent edge and said at least one correction feature is a distance that is greater than a minimum distance and less than a given nominal distance which is in the range of said resolution limit of said lithographic process, wherein said minimum distance is less than said wavelength.

9. The method described in claim 8 wherein said physical characteristic is the width of said at least one correction feature.

10. The method as described in claim 9 wherein said step of adjusting comprises adjusting said width of said at least one correction feature to be a dimension that is less than a given nominal width which is in the range of $\lambda/3$.

11. The method as described in claim 9 wherein said step of adjusting comprises adjusting said width of said at least one correction feature to be a dimension that is greater than a given nominal width which is in the range of $\lambda/3$ and less than a given maximum unresolvable width.

12. The method as described in claim 9 wherein said step of adjusting comprises forming said at least one correction feature as a dashed feature.

13. The method as described in claim 9 or 8 wherein said original placement of said at least one adjacent edge is moved towards said at least one correction feature.

14. The method as described in claim 9 or 8 wherein said original placement of said at least one adjacent edge is moved away from said at least one correction feature.

15. The method as described in claim 12 wherein said step of forming said at least one dashed feature comprises further controlling an effective width of said at least one dashed feature by adjusting its dash length to dash separation ratio and its dash pitch.

16. A method using at least one correction feature having an associated width to correct for proximity effects of two adjacent primary features on a mask in a lithographic process using an exposure tool having an associated wavelength ($\lambda$) and having an associated maximum unresolvable width which is dependent on processing parameters of said lithographic process, said primary features being spaced apart a given distance and each having an associated edge adjacent to said at least one correction feature and said each adjacent edge having an original placement, said method comprising the steps of:

determining a number of correction features to be placed between said two primary features so that the separation space between each of said adjacent edges of said primary features and an adjacent one of said at least one correction feature is a distance that is greater than a minimum distance and less than a given nominal distance which is in the range of said resolution limit of said lithographic process, wherein said minimum distance is less than said wavelength;

placing said number of correction features between said two adjacent features.

17. The method as described in claim 16 wherein said a single correction feature is placed between said two primary features.

18. The method as described in claim 16 wherein said two correction features are placed between said two primary features.

19. The method as described in claim 17 wherein said given distance (d) is in the range of $5\lambda/3 \leq d < 7\lambda/3$.

20. The method as described in claim 18 wherein said given distance (d) is in the range of $7\lambda/3 < d < 10\lambda/3$.

21. The method as described in claims 19 or 20 wherein said associated width is a given nominal width which is in the range of said maximum unresolvable width.

22. The method as described in claims 19 or 20 wherein said width is less than a given nominal width which is in the range of $\lambda/3$.

23. The method as described in claims 19 or 20 wherein said at least one correction feature is a dashed line and said associated width is a given nominal width which is in the range of said maximum unresolvable width.

24. The method as described in claim 17 wherein said given distance (d) is in the range of $5\lambda/3 \leq d < 7\lambda/3$ and wherein said width is less than said maximum unresolvable width and greater than a given nominal width which is in the range of $\lambda/3$.

25. A mask produced by said method of claims 8 or 16.

\* \* \* \* \*